United States Patent
Sakao

[19]

[11] Patent Number: 6,022,773
[45] Date of Patent: *Feb. 8, 2000

[54] METHOD OF MAKING A SEMICONDUCTOR DEVICE

[75] Inventor: Masato Sakao, Tokyo, Japan

[73] Assignee: NEC Corporation, Tokyo, Japan

[*] Notice: This patent is subject to a terminal disclaimer.

[21] Appl. No.: 08/984,521

[22] Filed: Dec. 3, 1997

Related U.S. Application Data

[60] Continuation of application No. 08/601,502, Feb. 14, 1996, Pat. No. 5,738,616, which is a division of application No. 08/530,994, Sep. 20, 1995, Pat. No. 5,652,446.

[30] Foreign Application Priority Data

Sep. 20, 1994 [JP] Japan .................................. 6-224395

[51] Int. Cl.[7] ................................................ H01L 21/8242
[52] U.S. Cl. ......................... 438/240; 438/396; 438/253; 257/310; 257/295; 257/306; 257/308; 257/311
[58] Field of Search ..................................... 438/240, 396, 438/253; 257/310, 295, 306, 308, 311

[56] References Cited

U.S. PATENT DOCUMENTS

| | | |
|---|---|---|
| 5,187,638 | 2/1993 | Sandhu et al. . |
| 5,332,684 | 7/1994 | Yamamichi et al. . |
| 5,352,622 | 10/1994 | Chung . |
| 5,366,920 | 11/1994 | Yamamichi et al. . |
| 5,405,796 | 4/1995 | Jones, Jr. . |
| 5,436,477 | 8/1995 | Hashizume et al. . |
| 5,478,772 | 12/1995 | Fazan . |
| 5,576,928 | 11/1996 | Summerfelt et al. . |
| 5,581,436 | 12/1996 | Summerfelt et al. . |
| 5,583,068 | 12/1996 | Jones, Jr. et al. . |
| 5,585,300 | 12/1996 | Summerfelt . |
| 5,622,893 | 4/1997 | Summerfelt et al. . |

FOREIGN PATENT DOCUMENTS 4242971  8/1992  Japan .

OTHER PUBLICATIONS

Koyama, et al., "A Stacked Capacitor with $(Ba_xSr_{1-x})TiO_3$ for 256M DRAM", *IEDM Technical Digest*, 1991, pp. 823–826.

*Primary Examiner*—John F. Niebling
*Assistant Examiner*—Lynne A. Gurley
*Attorney, Agent, or Firm*—Sughrue, Mion, Zinn Macpeak & Seas, PLLC

[57] ABSTRACT

There is provided a semiconductor device, including: a semiconductor substrate having a major surface; a first insulating film formed on the major surface of the semiconductor substrate; a plurality of first conductive members spaced apart from each other on the first insulating film and formed to be connected to the semiconductor substrate; a plurality of storage electrodes formed on the first insulating film at positions respectively corresponding to the first conductive members; a plurality of high-permittivity films respectively stacked on the plurality of storage electrodes; a plurality of first counter electrodes respectively stacked on the plurality of high-permittivity films; a second insulating film, having a permittivity much lower than a permittivity of each of the high-permittivity films, for insulating the first conductive members, the high-permittivity films, and the first counter electrodes, respectively; and a second counter electrode, formed on the second insulating film, for connecting adjacent first counter electrodes on an upper surface of the second counter electrode, and a method of manufacturing the semiconductor device.

24 Claims, 9 Drawing Sheets

METHOD OF MAKING A SEMICONDUCTOR DEVICE

This is a continuation of application Ser. No. 08/601,502 filed Feb. 14, 1996, now U.S. Pat. No. 5,728,616, which is a divisional of prior application Ser. No. 08/530,994 filed Sep. 20, 1995, now U.S. Pat. No. 5,652,446.

BACKGROUND OF THE INVENTION

1. Field of the Invention

The present invention relates to a memory cell suitable for applications to a highly integrated semiconductor memory and, more particularly, to a capacitor constituting a memory cell and a method of manufacturing the capacitor.

2. Description of the Prior Art

A memory cell (to be referred to as an 1T cell hereinafter) constituted by one transistor and one capacitor is known as a highly integrated semiconductor memory cell. The 1T cell is very popular because it requires a small number of constituent elements and facilitates a reduction in memory cell area.

An output voltage from a 1T cell is proportional to the capacitance value of a capacitor (to be referred to as a cell capacitor hereinafter) constituting a memory cell. For this reason, to assure the stable operation in a highly integrated arrangement, the capacitance value of the cell capacitor must be sufficiently large. To highly integrate 1T cells, cell capacitors each having a sufficiently large capacitance value in a small area are required.

A capacitor using a high-permittivity film, as described in *IEDM Technical Digest* 1991, pp. 823–826, is known as a typical conventional cell capacitor. This conventional cell capacitor is shown in FIG. 1.

As shown in FIG. 1, the cell capacitor has a silicon substrate 401 having a major surface. A silicon oxide film 402 is formed on the major surface of the silicon substrate 401. A plurality of contact holes are formed in the silicon oxide film 402. Impurity-doped polysilicon members 403 are buried in the plurality of contact holes, respectively. The silicon substrate 401 is electrically connected to a plurality of storage electrodes 406c each consisting of a tantalum film 404c and a platinum film 405c. A high-permittivity film 408c used as a capacitance film is formed on the entire surface including the plurality of storage electrodes 406c and the silicon oxide film 402. A counter electrode 409c is stacked on the high-permittivity film 408c to constitute cell capacitors.

In the above cell capacitors in FIG. 1, a 70-nm thick barium strontium titanate $((Ba_{0.5}Sr_{0.5})TiO_3)$ is used as the high-permittivity film 408c, the relative permittivity is 300 or more, and the capacitance value per unit area is 40 $fF/\mu m^2$. When this high-permittivity film is applied to a 64-M DRAM cell, a capacitance value of 36 fF is reported in the above reference. It is therefore confirmed that a sufficiently large capacitance value is obtained in a small area.

The platinum film 405c constituting each storage electrode 405c is used to have good antioxidation properties in forming the high-permittivity film 408c. The tantalum film 404c is used to prevent platinum of the platinum film 405c from diffusing into the silicon substrate 401.

In the structure shown in FIG. 1, the high-permittivity film 408c is present between the adjacent storage electrodes 406c. The coupling capacitance between the adjacent storage electrodes 406c is calculated to be as very large as about $2.8 \times 10^{-15}$ F according to a plane-parallel approximation. For this reason, in read/write access of information to the cell capacitor, the potential of each storage electrode 406c varies. This potential variation causes noise, and a stable memory operation cannot be obtained.

As a method of solving this problem, there is a cell capacitor cell structure disclosed in Japanese Unexamined Patent Publication No. 4-242971. This technique will be described with reference to FIG. 2. FIG. 2 shows the structure of two memory cells. Each memory cell has a MOS transistor and a capacitor.

The MOS transistor has first and second n-type impurity regions 207 and 208 formed in a p-type silicon substrate 201, and a gate electrode 206 stacked through a gate oxide film 203. The first n-type impurity region 207 serves as one of the source and drain regions. The second n-type impurity region 208 serves as the other of the source and drain regions. A first insulating interlayer 209, a second insulating interlayer 217, and a third insulating interlayer 220 are formed over the gate oxide film 203 and the gate electrode 206 in order as named. A bit line 221 is electrically connected to the second n-type impurity region 208 through a contact hole 240 formed in the first to third insulating interlayers 209, 217, and 220.

The capacitor has a storage electrode 212 connected to the first n-type impurity region 207 through the gate oxide film 203, a counter electrode 214, and a high-permittivity film 213 sandwiched between the storage and counter electrodes 212 and 214. The counter electrode 214 adjacent to the exposed surface is connected to an interconnection 218 through a connection hole 241.

In the memory cell having the above structure, the relative permittivity of the high-permittivity film 213 is set higher than that of the second insulating interlayer 217 to relax concentration of an electric field on the side surfaces of each storage electrode 212, thereby forming a capacitor having a high breakdown voltage. This arrangement is employed to increase the breakdown voltage. In addition, the relative permittivity of the second insulating interlayer 217 is reduced to decrease the coupling capacitance between the capacitors as described above and provide a high resistance against noise. However, since the connection holes 241 are formed for the counter electrodes 214, respectively, the defects of the connection holes 241 directly cause defective memory cells to decrease the product yield.

A technique for reducing a coupling capacitance between capacitors without forming contact holes, which cause a decrease in product yield, in the respective counter electrodes is disclosed in Japanese Unexamined Patent Publication No. 6-85193. This technique will be described with reference to the accompanying drawings.

FIG. 3 shows the structure of these capacitors. Each capacitor has a storage electrode 306 obtained by stacking tantalum 304 and platinum 305, a high-permittivity film 308 stacked on the storage electrode 306, and a counter electrode 309. An insulating film 307 is formed between the adjacent storage electrodes 306. A silicon substrate 301 is electrically connected to each storage electrode 306 through a polysilicon member 303 buried in a corresponding contact hole formed in a silicon oxide film 302 on the silicon substrate 301. The relative permittivity of the high-permittivity film 308 is set much lower than that of the insulating film 307 to reduce the coupling capacitance between the capacitors. However, a method of manufacturing this capacitor poses a problem which degrades the reliability of the capacitor itself. This manufacturing method will be described with reference to FIGS. 4A to 4E.

First, referring to FIG. 4A, the silicon substrate 301 is thermally oxidized to form the silicon oxide film 302 thereon. Contact holes are formed using the conventional photolithography and dry etching techniques, and polysilicon is grown in these contact holes by the CVD method. In this case, phosphorus is thermally diffused in this polysilicon, and the polysilicon is etched back using dry etching to bury it in the contact holes, thereby forming first conductive members 303.

Referring to FIG. 4B, the tantalum film 304 and the platinum film 305 are stacked on the entire surface by sputtering. Barium strontium titanate $((Ba_{0.5}Sr_{0.5})TiO_3)$ is grown at a growth temperature of 650° C. by RF magnetron sputtering to form the high-permittivity film 308. A storage electrode formation resist film 310 is then formed by conventional photolithography.

Referring to FIG. 4C, the high-resistivity film 308, the platinum film 305, and the tantalum film 304 are etched by dry etching, and the resist film 310 is removed. Each storage electrode 306 is constituted by the tantalum film 304 and the platinum film 305.

Referring to FIG. 4D, the insulating film 307 consisting of a silicon oxide film is buried and deposited by CVD to planarize the upper surface to a desired degree.

Referring to FIG. 4E, the insulating film 307 is etched back by dry etching until the upper surface of the insulating film 307 is leveled with the upper surface of the high-permittivity film 308. By this etch-back process, the surface of the high-permittivity film 308 is perfectly exposed, and the film quality is degraded. That is, the high-permittivity film 308 is damaged by etching, and an impurity is mixed therein. Then the counter electrode 309 consisting of a titanium nitride film is stacked on the entire surface to obtain the capacitors shown in FIG. 3.

In this structure, the connection holes (contact holes) need not be formed in units of capacitors, unlike the above prior art, and the number of manufacturing steps can be reduced, thereby preventing a decrease in product yield in this respect. However, since the surface of the high-permittivity film 308 is exposed to an etching atmosphere which degrades the film quality, the reliability of the device is degraded as a whole.

BRIEF SUMMARY OF THE INVENTION

The present invention has been made in consideration of the above situation of the conventional techniques, and has as its principal object to reduce the coupling capacitance in capacitors each using a high-permittivity film as a capacitance film.

It is another object of the present invention to provide a capacitor and a method of manufacturing the same, wherein all problems such as a decrease in device yield and degradation of reliability of the device can be perfectly eliminated.

To achieve the above object, according to the first aspect of a semiconductor device of the present invention, there is provided a semiconductor device, comprising: a semiconductor substrate having a major surface; a first insulating film formed on the major surface of the semiconductor substrate; a plurality of first conductive members spaced apart from each other on the first insulating film and formed to be connected to the semiconductor substrate; a plurality of storage electrodes formed on the first insulating film at positions respectively corresponding to the first conductive members; a plurality of high-permittivity films respectively stacked on the plurality of storage electrodes; a plurality of first counter electrodes respectively stacked on the plurality of high-permittivity films; a second insulating film, having a permittivity much lower than a permittivity of each of the high-permittivity films, for insulating the first conductive members, the high-permittivity films, and the first counter electrodes, respectively; and a second counter electrode, formed on the second insulating film, for connecting adjacent first counter electrodes on an upper surface of the second counter electrode According to the second aspect of a semiconductor device of the present invention, there is provided a semiconductor device, comprising: a semiconductor substrate having a major surface; a first insulating film formed on the major surface of the semiconductor substrate; a plurality of first conductive members spaced apart from each other on the first insulating film and formed to be connected to the semiconductor substrate; a plurality of storage electrodes formed on the first insulating film at positions respectively corresponding to the first conductive members; a plurality of high-permittivity films having predetermined shapes and stacked to contact upper and side surfaces of the plurality of storage electrodes; a plurality of first counter electrodes having predetermined shapes and stacked on the plurality of high-permittivity films; a second insulating film, having a permittivity much lower than a permittivity of each of the high-permittivity films, for insulating the first conductive members, the high-permittivity films, and the first counter electrodes, respectively; and a second counter electrode, formed on the second insulating film, for connecting adjacent first counter electrodes on an upper surface of the second counter electrode.

The sizes of each high-permittivity film and each first counter electrode, which are formed on each storage electrode, are smaller than or equal to the size of the storage electrode.

According to the first aspect of a method of manufacturing a semiconductor device of the present invention, there is provided a method of manufacturing a semiconductor device, comprising the steps of: depositing first conductive members to be connected to a semiconductor substrate in a plurality of openings formed in a first insulating film formed on a major surface of the semiconductor substrate; depositing a storage electrode film on the first insulating film; etching the storage electrode film to form a plurality of storage electrodes having predetermined shapes at positions respectively corresponding to the first conductive members; sequentially depositing a high-permittivity film and a first counter electrode on the plurality of storage electrodes having the predetermined shapes and the first insulating film; processing the high-permittivity film and the first counter electrode to form a plurality of high-permittivity films having predetermined shapes and a plurality of first conductive electrodes having predetermined shapes on the plurality of storage electrodes; burying a second insulating film between a plurality of convex multi-layered structures, the plurality of convex multi-layered structures being adjacent each other and consisting of the storage electrodes, the high-permittivity films, and the first counter electrodes, and the second insulating film having a permittivity much lower than a permittivity of each of the high-permittivity films; and forming a second counter electrode on upper surfaces of the second insulating film and the plurality of first counter electrodes so as to connect upper surfaces of the first counter electrodes exposed on a surface of the second insulating film.

According to the second aspect of a manufacturing method of the present invention, there is provided a method of manufacturing a semiconductor device, comprising the steps of: depositing first conductive members to be connected to a semiconductor substrate in a plurality of openings formed in a first insulating film formed on a major surface of the semiconductor substrate; sequentially depositing a storage electrode film, a high-permittivity film, and a first counter electrode film on the first insulating film and the first conductive members; sequentially etching the first counter electrode film, the high-permittivity film, and the storage electrode film to form a plurality of first counter electrodes having predetermined shapes, a plurality of storage electrodes having predetermined shapes, and a plurality of high-permittivity films having predetermined shapes; burying a second insulating film between a plurality of convex multi-layered structures, the plurality of convex multi-layered structures being adjacent each other and consisting of the storage electrodes, the high-permittivity films, and the first counter electrodes, and the second insulating film having a permittivity much lower than a permittivity of each of the high-permittivity films; and forming a second counter electrode on upper surfaces of the second insulating film and the plurality of first counter electrodes so as to connect upper surfaces of the first counter electrodes exposed on a surface of the second insulating film.

According to the third aspect of a manufacturing method of the present invention, there is provided a method of manufacturing a semiconductor device, comprising the steps of: depositing first conductive members to be connected to a semiconductor substrate in a plurality of openings formed in a first insulating film formed on a major surface of the semiconductor substrate; depositing a storage electrode film on the first insulating film; etching the storage electrode film to form a plurality of storage electrodes having predetermined shapes at positions respectively corresponding to the first conductive members; forming a high-permittivity film on the first insulating film and the plurality of storage electrodes so as to contact upper and side surfaces of the storage electrodes, and further forming a first counter electrode film on the high-permittivity film; sequentially etching the first counter electrode film and the high-permittivity film to form a plurality of high-permittivity films having predetermined shape and a plurality of first counter electrodes having predetermined shapes on the plurality of storage electrodes; burying a second insulating film between a plurality of convex multi-layered structures, the plurality of convex multi-layered structures being adjacent each other and consisting of the storage electrodes, the high-permittivity films, and the first counter electrodes, and the second insulating film having a permittivity much lower than a permittivity of each of the high-permittivity films; and forming a second counter electrode on upper surfaces of the second insulating film and the plurality of first counter electrodes so as to connect upper surfaces of the first counter electrodes exposed on a surface of the second insulating film.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

DETAILED DESCRIPTION OF PREFERRED EMBODIMENTS

Preferring embodiments of the present invention will be described below in detail with reference to the accompanying drawings.

Figure 5:
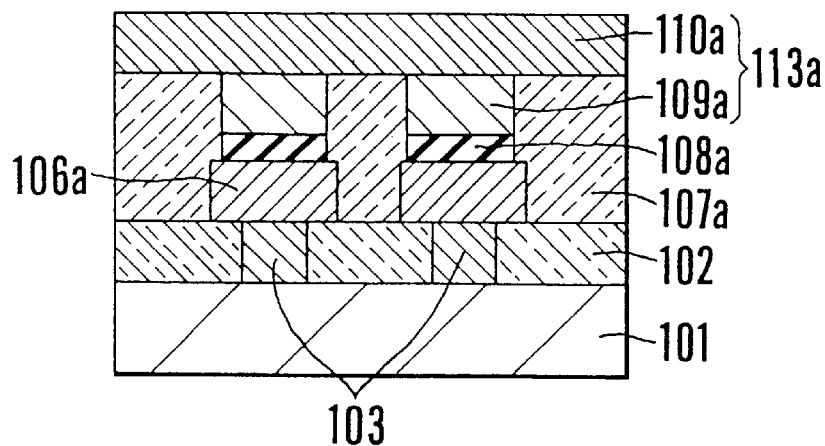
FIG. 5 is a sectional view showing the structure of a semiconductor device (capacitors) according to the first embodiment of the present invention.

FIG. 5 shows capacitors according to the first embodiment of the present invention. In the first embodiment shown in FIG. 5, each capacitor has a storage electrode 106a, a high-permittivity film 108a stacked on the storage electrode 106a, and a counter electrode 113a. The counter electrode 113a is constituted by stacking a first counter electrode 109a, formed for each capacitor, and a second counter electrode 110a for connecting a plurality of first counter electrodes 109a. An insulating film 107a is formed between the adjacent storage electrodes 106a, high-permittivity films 108a, and first counter electrodes 109a. A silicon substrate 101 is electrically connected to each storage electrode 106a through a polysilicon member 103 buried in a corresponding contact hole formed in a silicon oxide film 102 on the silicon substrate 101.

A method of manufacturing the capacitors shown in FIG. 5 will be described next with reference to FIGS. 6A to 6G.

Figure 6A:
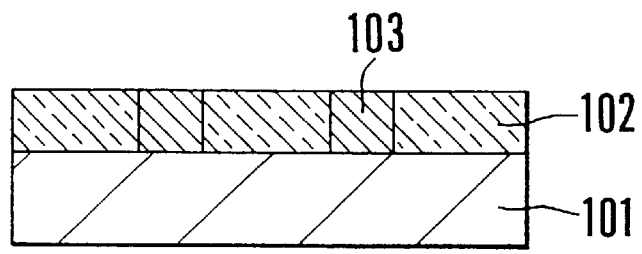
FIGS. 6A to 6G are sectional views sequentially showing steps for explaining a method of manufacturing the semiconductor device shown in FIG. 5.

First, referring to FIG. 6A, the silicon substrate 101 is thermally oxidized to form the silicon oxide film 102 as the first insulating film. Contact holes are formed using the conventional photolithography and dry etching techniques, and polysilicon is grown in these contact holes by the CVD method. In this case, an n-type impurity such as phosphorus is thermally diffused in this polysilicon, and the polysilicon is etched back using dry etching to bury it in the contact holes, thereby forming the polysilicon members or first conductive members 103.

Figure 6B:
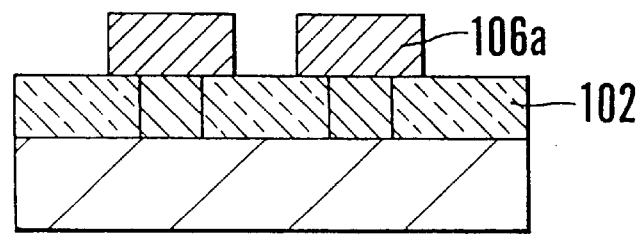

Referring to FIG. 6B, a ruthenium oxide ($RuO_2$) film is formed by reactive sputtering and processed into the shape of the storage electrode 106a using the conventional photolithography and dry etching techniques.

Figure 6C:
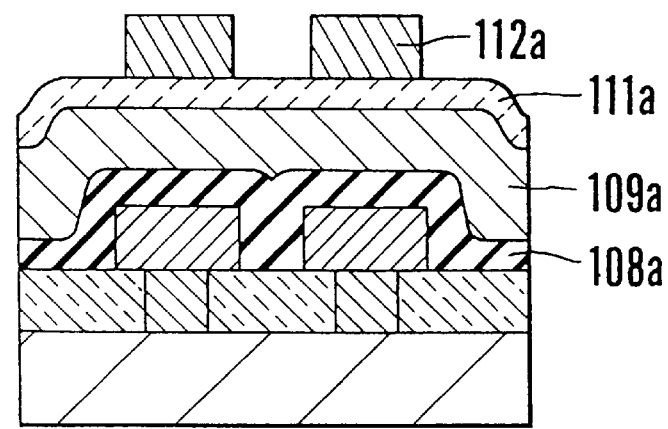

Referring to FIG. 6C, barium strontium titanate $((Ba_{0.5}Sr_{0.5})TiO_3)$ is grown at a growth temperature of 650°

C. by, e.g., RF magnetron sputtering to form the high-permittivity film 108a. A titanium nitride film serving as the first counter electrode 109a is formed on the high-permittivity film 108a. Subsequently, an oxide film is deposited as a mask member 111a used for etching these stacked films. A resist film 112a is formed by conventional photolithography.

Figure 6D:
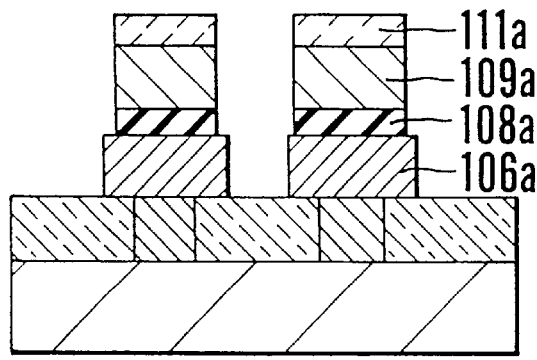

Referring to FIG. 6D, the mask member 111a, the first counter electrode 109a, and the high-permittivity film 108a are sequentially etched in this state. At this time, the size (flat area) of each of the mask member 111a, the first counter electrode 109a, and the high-permittivity film 108a is set smaller than the size of the storage electrode 106a to form an alignment margin with respect to the storage electrode 106a.

Figure 6E:
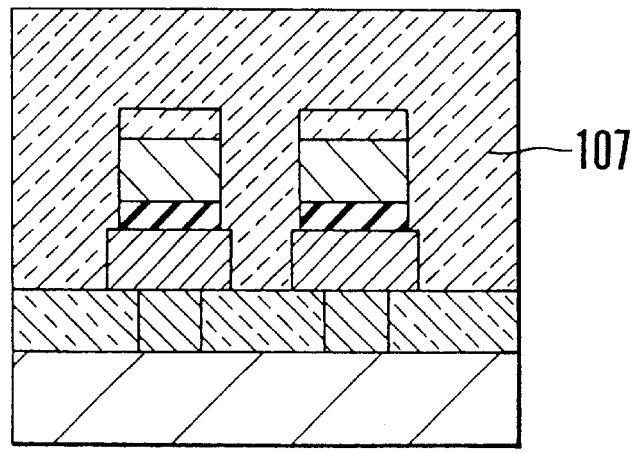

Referring to FIG. 6E, a second insulating film 107 consisting of a silicon oxide film is deposited by the CVD method to completely cover the mask members 111a, the first counter electrodes 109a, the high-permittivity films 108a, and the storage electrodes 106a while the upper surface is planarized to a desired degree.

Figure 6F:
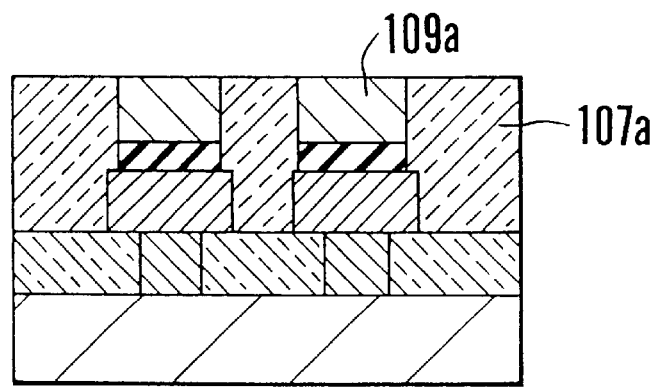

Referring to FIG. 6F, this insulating film 107 is etched back by dry etching until the upper surface of the insulating film 107 is leveled with the upper surface of the first counter electrode 109a, thereby forming the insulating film 107a. At the same time of the etch back of the insulating film 107, the mask members 111a are also etched and removed.

Figure 6G:
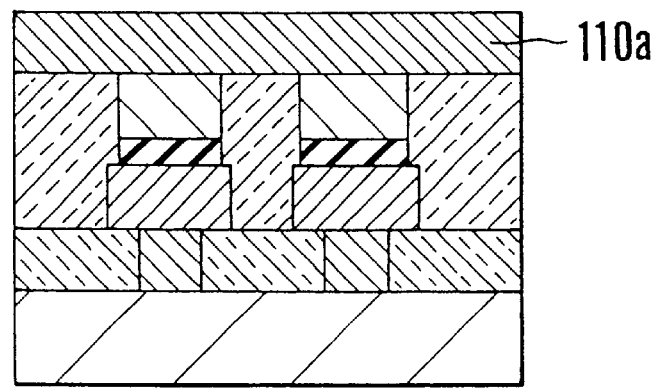

Referring to FIG. 6G, a titanium nitride film serving as the second counter electrode 110a is formed and stacked on this structure, thereby obtaining the capacitors shown in FIG. 5.

Figure 7:
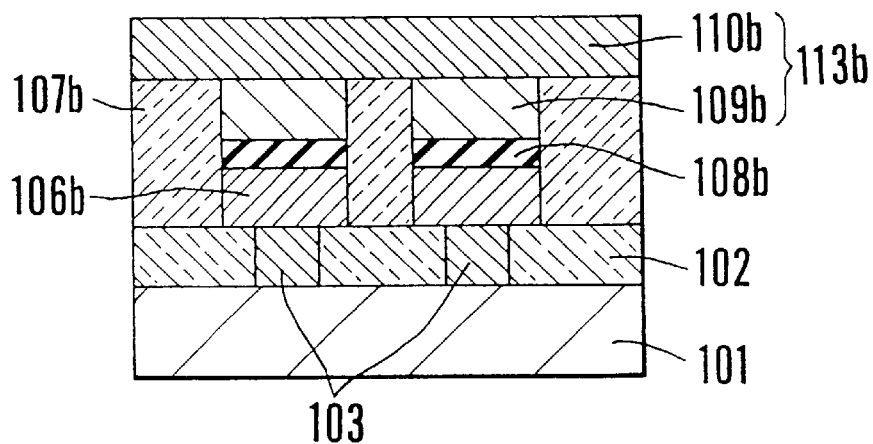
FIG. 7 is a sectional view showing the structure of a semiconductor device (capacitors) according to the second embodiment of the present invention.

FIG. 7 shows capacitors according to the second embodiment of the present invention. In the capacitors shown in FIG. 5, as described in the manufacturing method, the high-permittivity films 108a and the first counter electrodes 109a are formed after processing the storage electrodes 106a. For this reason, particularly, the size of each high-permittivity film 108a becomes smaller than that of each storage electrode 106a which undesirably decreases the storage capacitance. Each capacitor according to the second embodiment, however, assures a storage capacitance larger than that in the first embodiment because the size of a storage electrode 106b is set equal to that of a high-permittivity film 108b.

A method of manufacturing the capacitors shown in FIG. 7 will be described below with reference to FIGS. 8A to 8F.

Figure 8A:
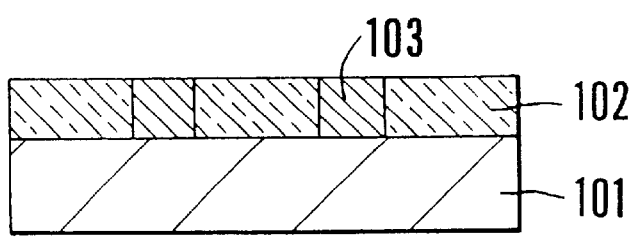
FIGS. 8A to 8F are sectional views sequentially showing steps for explaining a method of manufacturing the semiconductor device shown in FIG. 7.

First, referring to FIG. 8A, a silicon substrate 101 is thermally oxidized to form a silicon oxide film 102. Contact holes are formed using the conventional photolithography and dry etching techniques, and polysilicon is grown in these contact holes by the CVD method. In this case, an n-type impurity such as phosphorus is thermally diffused in this polysilicon, and the polysilicon is etched back using dry etching to bury it in the contact holes, thereby forming first conductive members 103.

Figure 8B:
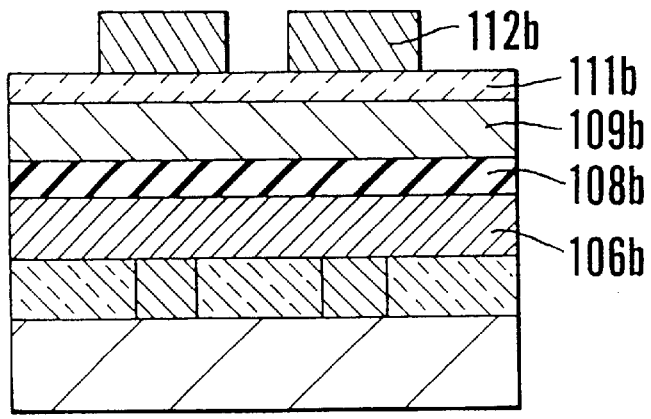

Referring to FIG. 8B, ruthenium oxide ($RuO_2$) is grown by, e.g., reactive sputtering to form a storage electrode 106b. Barium strontium titanate (($Ba_{0.5}Sr_{0.5}$)$TiO_3$) is grown at a growth temperature of 650° C. by, e.g., RF magnetron sputtering to form the high-permittivity film 108b. A titanium nitride film is formed as a first counter electrode 109b. Subsequently, an oxide film is deposited as a mask member 111b used for etching these stacked films. A resist film 112b is patterned by conventional photolithography.

Figure 8C:
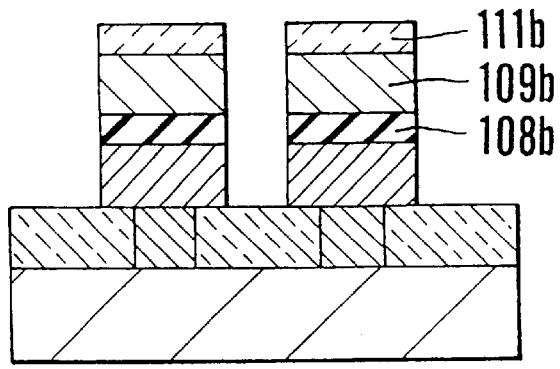

Referring to FIG. 8C, the mask member 111b, the first counter electrode 109b, the high-permittivity film 108b, and the storage electrode 106b are sequentially etched from this state. At this time, the size (flat area) of the storage electrode 106b is set equal to the size of each of the mask member 111b, the first counter electrode 109b, and the high-permittivity film 108b.

Figure 8D:
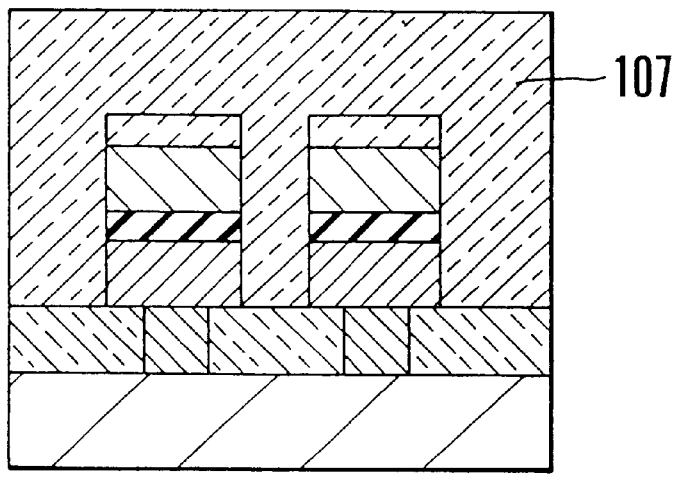

Referring to FIG. 8D, an insulating film 107 consisting of a silicon oxide film is deposited by, e.g., the CVD method to completely cover the mask members 111b, the first counter electrodes 109b, the high-permittivity films 108b, and the storage electrodes 106b while the upper surface is planarized to a desired degree.

Figure 8E:
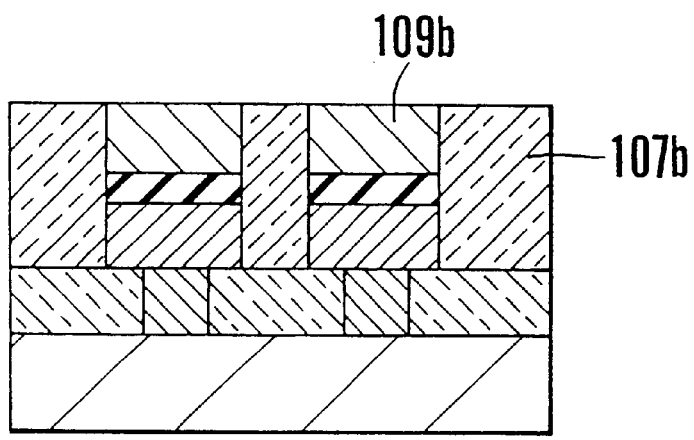

Referring to FIG. 8E, this insulating film 107 is etched back by dry etching until the upper surface of the insulating film 107 is level with the upper surface of the first counter electrode 109b, thereby forming an insulating film 107b. At the same time of the etch back of the insulating film 107, the mask members 111b are also etched and removed.

Figure 8F:
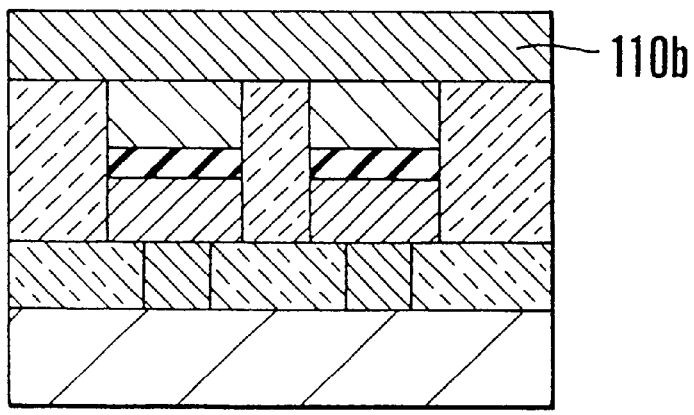

Referring to FIG. 8F, a titanium nitride film serving as the second counter electrode 110b is formed and stacked on this structure, thereby obtaining the capacitors shown in FIG. 7.

Figure 9:
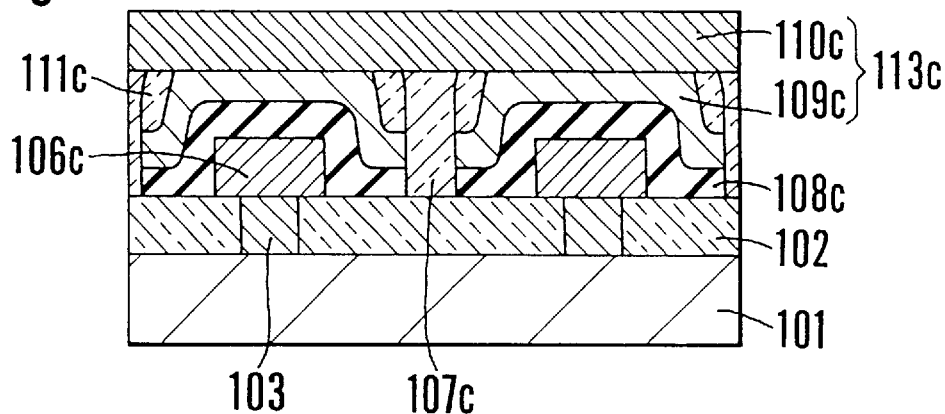
FIG. 9 is a sectional view showing the structure of a semiconductor device (capacitors) according to the third embodiment of the present invention.

FIG. 9 shows capacitors according to the third embodiment of the present invention. In each of the capacitors shown in FIGS. 5 and 7, the high-permittivity film is formed only on the upper surface of each storage electrode, so that an area used as a capacitor portion is limited to the upper area of the storage electrode. To the contrary, in each capacitor shown in FIG. 9, side wall portions of a storage electrode can be used as a capacitor portion in addition to the upper surface of the storage electrode, thereby assuring a larger capacitance.

A method of manufacturing the capacitors shown in FIG. 9 will be described below with reference to FIGS. 10A to 10G.

Figure 10A:
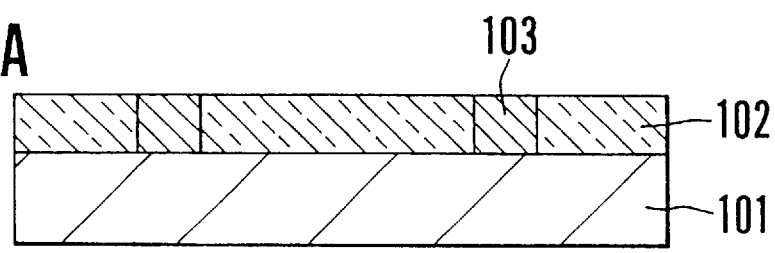
FIGS. 10A to 10G are sectional views sequentially showing steps for explaining a method of manufacturing the semiconductor device shown in FIG. 9.

First, referring to FIG. 10A, a silicon substrate 101 is thermally oxidized to form a silicon oxide film 102. Contact holes are formed using the conventional photolithography and dry etching techniques, and polysilicon Is grown in these contact holes by the CVD method. In this case, an n-type impurity such as phosphorus is thermally diffused in this polysilicon, and the polysilicon is etched back using dry etching to bury it in the contact holes, thereby forming first conductive members 103.

Figure 10B:
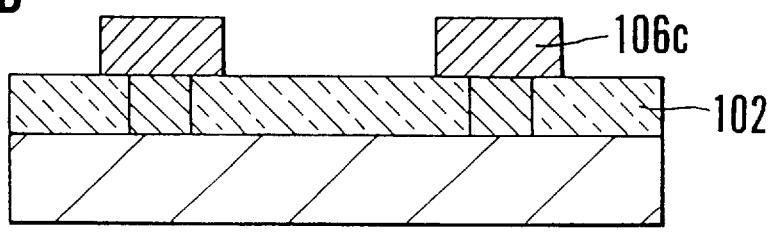

Referring to FIG. 10B, ruthenium oxide ($RuO_2$) is grown by, e.g., reactive sputtering to form storage electrodes 106c. The ruthenium oxide is processed into the shape of the storage electrode 106c shown in FIG. 10B by the conventional photolithography and dry etching techniques.

Figure 10C:
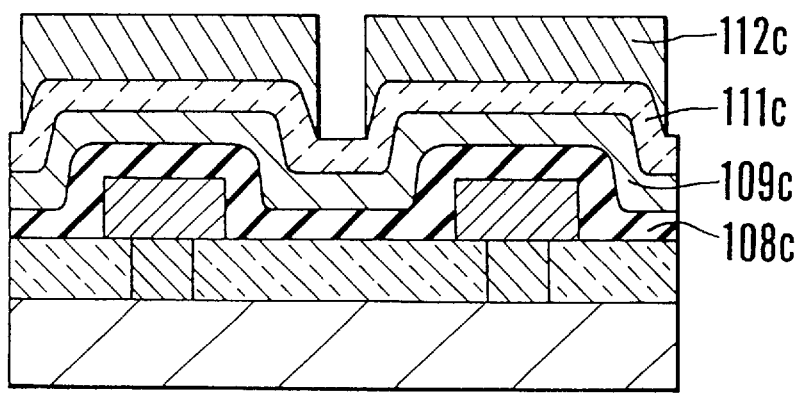

Referring to FIG. 10C, barium strontium titanate (($Ba_{0.5}Sr_{0.5}$)$TiO_3$) is grown at a growth temperature of 650° C. by, e.g., RF magnetron sputtering to form a high-permittivity film 108c. A titanium nitride film is formed thereon as a first counter electrode 109c. Subsequently, an oxide film is deposited as a mask member 111c used for etching these stacked films. A resist film 112c is patterned by conventional photolithography. At this time, the size of the resist film 112c is set outwardly larger than that of the storage electrode 106c so as to have an alignment margin, unlike in the first embodiment.

Figure 10D:
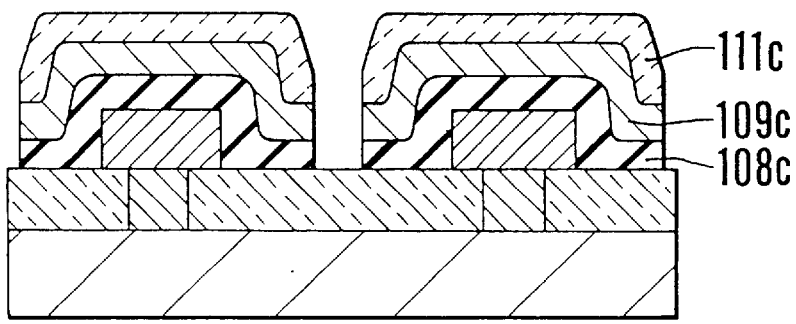

Referring to FIG. 10D, the mask member 111c, the first counter electrode 109c, and the high-permittivity film 108c are sequentially etched in this state to remove the resist film 112c. At this time, the adjacent mask members 111c, first counter electrodes 109c, and high-permittivity films 108c are formed not to contact each other.

Figure 10E:
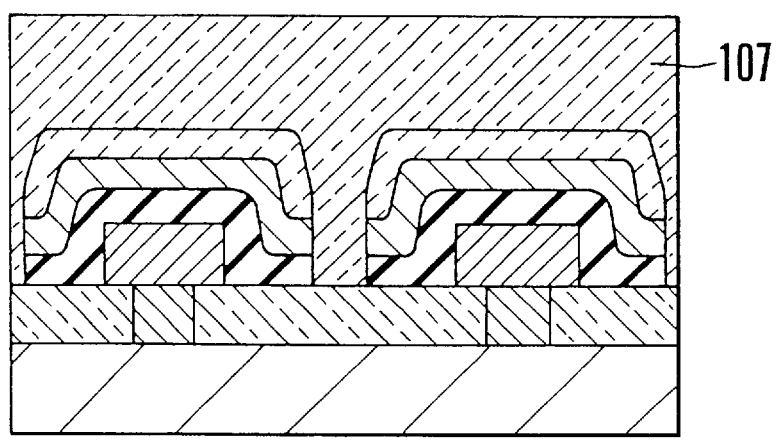

Referring to FIG. 10E, an insulating film 107 consisting of a silicon oxide film is deposited by, e.g., the CVD method to completely cover the mask members 111c, the first counter electrodes 109c, and the high-permittivity films 108c while the upper surface is planarized to a desired degree.

Figure 10F:
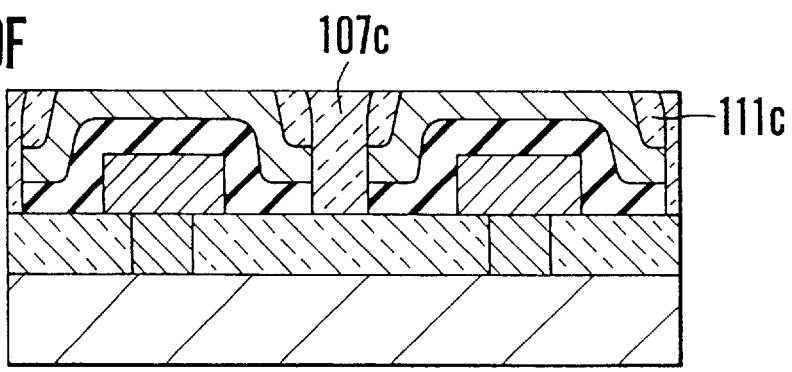

Referring to FIG. 10F, this insulating film 107 is etched back by dry etching until the upper surface of the insulating film 107 is leveled with the upper surface of the first counter electrode 109c, thereby forming an insulating film 107c. At the same time of the etch back of the insulating film 107, the mask members 111c formed on the first counter electrodes 109c are also etched and removed.

Figure 10G:
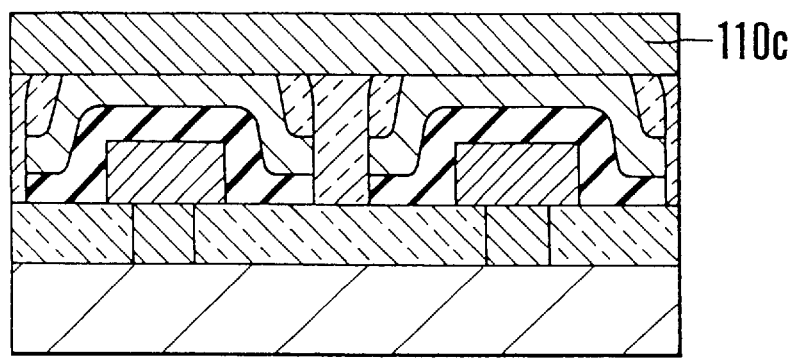

Referring to FIG. 10G, a titanium nitride film serving as the second counter electrode 110c is formed and stacked on this structure, thereby obtaining the capacitors shown in FIG. 9.

In the first and second embodiments, the cell size is about $0.6 \times 1.2$ $\mu m^2$ ($0.72$ $\mu m^2$), and the capacitor can be used for a 256-M DRAM cell.

Figure 1:
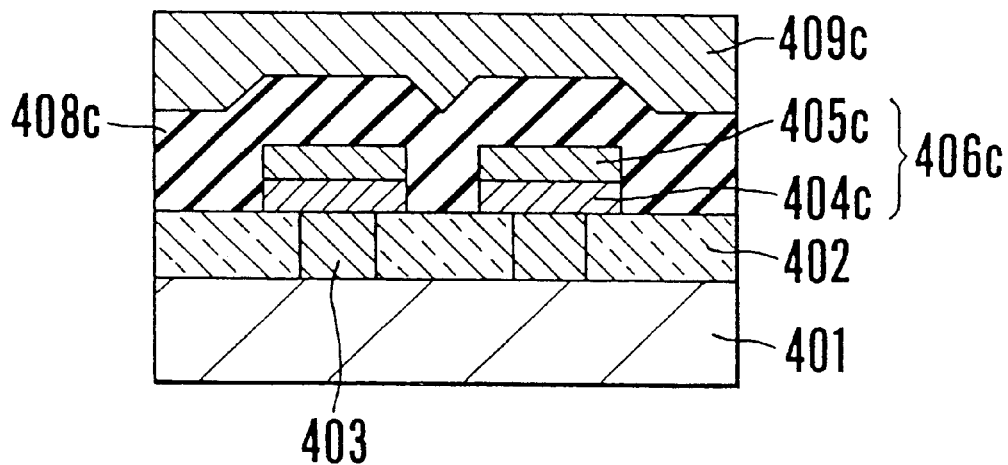
FIG. 1 is a sectional view showing the structure of a conventional semiconductor device (capacitors) according to the first example.
Figure 3:
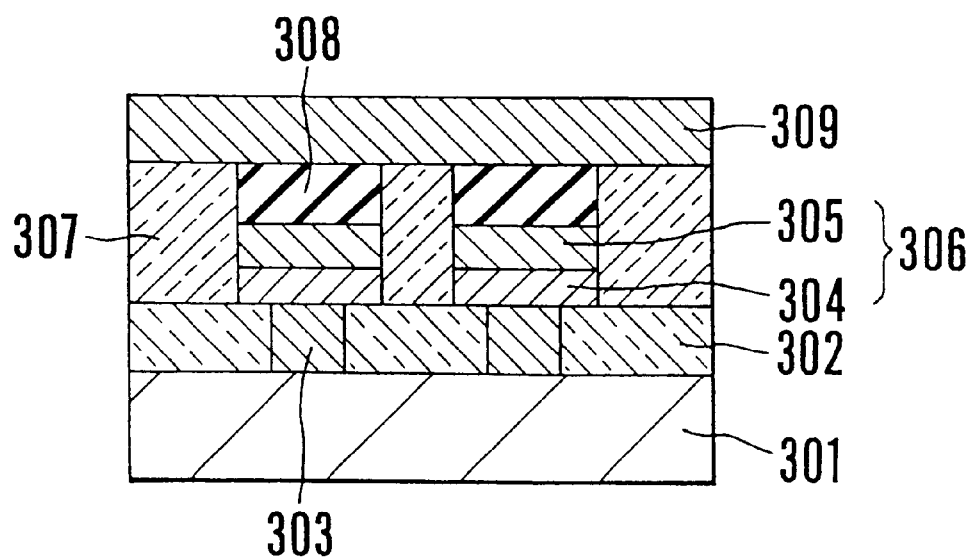
FIG. 3 is a sectional view showing the structure of a conventional semiconductor device (capacitors) according to the third example.
Figure 2:
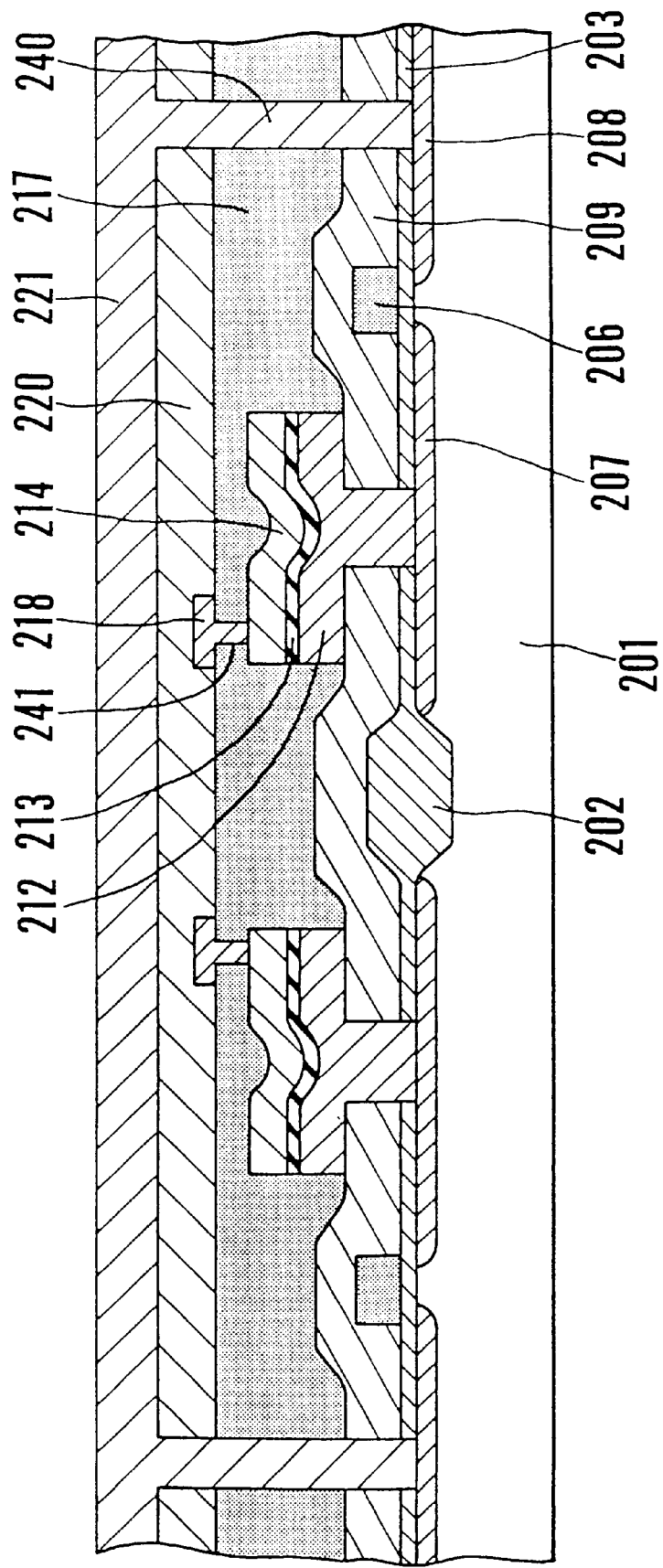
FIG. 2 is a sectional view showing the structure of a conventional semiconductor device (memory cells) according to the second example.
Figure 4A:
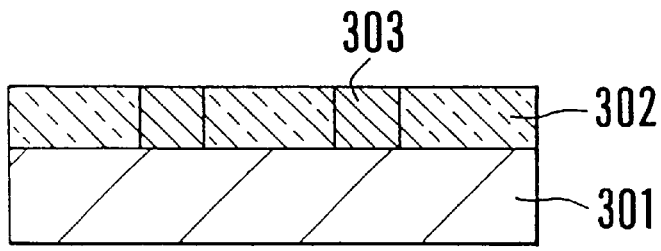
FIGS. 4A to 4E are sectional views sequentially showing steps for explaining a method of manufacturing the semiconductor device shown in FIG. 3.
Figure 4B:
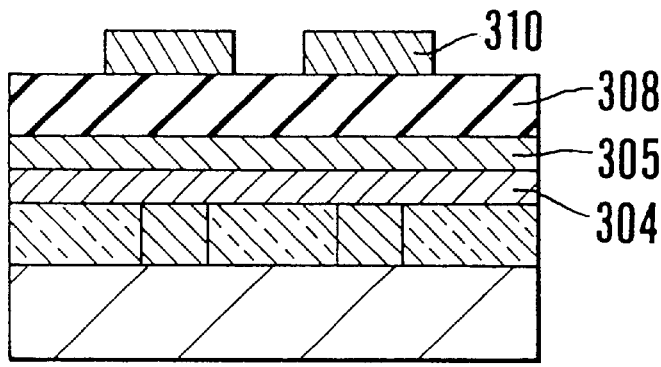
Figure 4C:
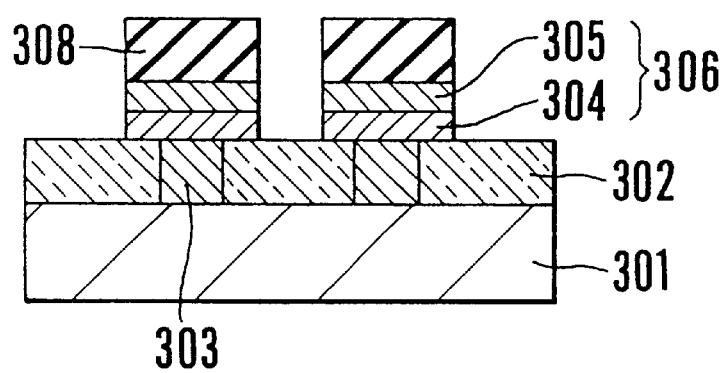
Figure 4D:
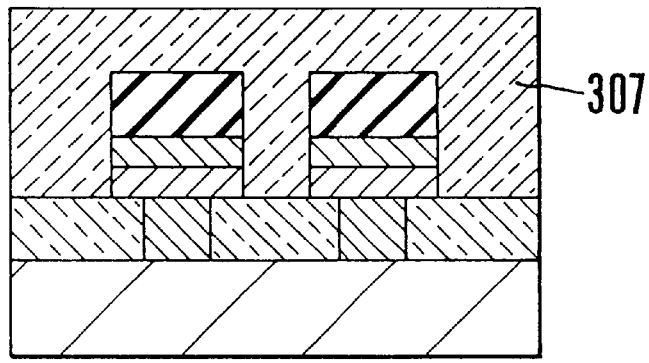
Figure 4E:
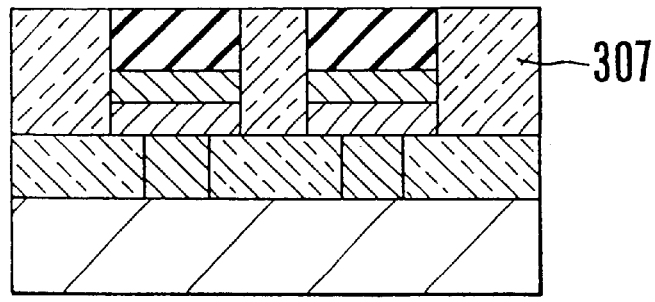

The insulating film having a relative permittivity lower than that of the high-permittivity film as a capacitance film is present between the adjacent storage electrodes. For this reason, the coupling capacitance between the adjacent storage electrodes in the second embodiment having a more advantageous structure is calculated to be $1.3 \times 10^{-17}$ F according to a plane-parallel approximation. The calculated coupling capacitance is much smaller than that in the conventional structure shown in FIG. 1.

Although the present invention has been described with respect to the embodiments, the present invention is not limited to the above embodiments, and various changes and modifications are deemed to lie within the spirit and scope of the invention. For example, in the above embodiments, the silicon substrate is connected to the storage electrodes through the conductive members consisting of polysilicon buried in the contact holes. The structure is not limited to this. The present invention can employ a structure in which a storage electrode is directly arranged on a silicon substrate using no conductive member, and a shape in which a storage electrode is very thin, and a high-permittivity film is substantially directly arranged on a silicon substrate if a low-permittivity insulating film is arranged between adjacent storage electrodes and adjacent high-permittivity films.

Although each of the embodiments exemplifies a single-layered structure consisting of a ruthenium oxide film for the storage electrode, the ruthenium oxide film may react with a polysilicon underlayer at some film formation temperatures. To prevent this reaction, a barrier film such as titanium nitride (TiN) may be arranged. The multi-layered structure of the storage electrode, which is a stacked structure in the above embodiments, is determined in accordance with annealing after forming this capacitor, and is not limited to a single- or two-layered structure. For example, it is possible to select polysilicon as the material of the undermost layer of the storage electrode having a multi-layered structure, and to select a material containing tantalum and platinum as main raw materials for a two-layered structure.

For the conductive member for connecting the storage electrode to the silicon substrate, polysilicon in which an impurity is diffused is used. In addition to this, titanium nitride or a stacked structure of titanium and titanium nitride may be used for the conductive member. The shape and film thickness of the conductive member are not limited to the above embodiments. The validity of the present invention is not degraded with a conductive member having a small thickness of several tens nm as long as it can electrically connect a substrate to a storage electrode, and good electrical connection is not degraded by a reaction between the substrate and the storage electrode.

For the high-permittivity film serving as a capacitance film, barium strontium titanate (($Ba_{0.5}Sr_{0.5}$)$TiO_3$) grown by RF magnetron sputtering is used. The film formation method is not limited to this, and also the material is not limited to this, provided that a material has a relative permittivity of 200 or more.

As has been described above, according to the present invention, generation of the coupling capacitance, which poses a problem when a high-permittivity film is present between adjacent storage electrodes, can be suppressed in the above-mentioned capacitors using the high-permittivity films as capacitance films. By suppressing the coupling capacitance, coupling noise between the capacitors can be reduced to enable highly reliable read/write access of memory information. In the structure of each capacitor, counter electrodes are not independently provided for cells, i.e., counter electrodes have no contact hole (connection hole) and no interconnection for connecting the counter electrodes, but counter electrodes are formed into a two-layered structure without any contact hole, in which the entire upper surface of the first lower counter electrode is connected to the second counter electrode. Therefore, a bad contact hole does not directly make a memory cell defective. According to the manufacturing method, the high-permittivity film used as a capacitance film is not damaged by, e.g., dry etching, thereby forming a highly reliable capacitance film and capacitor.

What we claimed is:

1. A method of manufacturing a semiconductor device, comprising the steps of:

forming a plurality of storage electrodes at respective positions over a major surface of a semiconductor substrate;

sequentially depositing a high-permittivity film and a first counter electrode on said plurality of storage electrodes;

processing said high-permittivity film and said first counter electrode to form a plurality of high-permittivity films and a plurality of first conductive electrodes on said plurality of storage electrodes;

burying a first insulating film between a plurality of convex multi-layered structures, said plurality of convex multi-layered structures being adjacent each other and consisting of said storage electrodes, said high-permittivity films, and said first counter electrodes, said first insulating film having a permittivity much lower than a permittivity of each of said high-permittivity films; and forming a second counter electrode on upper surfaces of said first insulating film and said plurality of first counter electrodes so as to connect upper surfaces of said first counter electrodes exposed on a surface of said first insulating film.

2. A method of manufacturing a semiconductor device as recited in claim 1, wherein sizes of each of said high-permittivity films and each of said first counter electrodes, which are formed on said storage electrodes, are smaller than a size of each of said storage electrodes.

3. A method of manufacturing a semiconductor device as recited in claim 1, wherein said high-permittivity film has a relative permittivity of 200 or more.

4. A method of manufacturing a semiconductor device as recited in claim 3, wherein said storage electrodes includes ruthenium oxide, said high-permittivity films are made of barium strontium titanate, said first counter electrodes are made of titanium nitride, said first insulating film is made of silicon oxide, and said second counter electrode is made of titanium nitride.

5. A method of manufacturing a semiconductor device as recited in claim 4, wherein said barium strontium titanate is formed by RF magnetron sputtering.

6. A method of manufacturing a semiconductor device as recited in claim 4, wherein said storage electrodes further include titanium nitride.

7. A method of manufacturing a semiconductor device as recited in claim 1, wherein said storage electrode includes tantalum and platinum.

8. A method of manufacturing a semiconductor device as recited in claim 1, further including the step of forming a second insulating film between said semiconductor substrate and said storage electrode.

9. A method of manufacturing a semiconductor device, comprising the steps of:

sequentially depositing a storage electrode film, a high-permittivity film, and a first counter electrode film over a major surface of a semiconductor substrate;

sequentially etching said first counter electrode film said high-permittivity film, and said storage electrode film to form a plurality of first counter electrodes, a plurality of storage electrodes, and a plurality of high-permittivity films;

burying a first insulating film between a plurality of convex multi-layered structures, said plurality of convex multi-layered structures being adjacent each other and consisting of said storage electrodes, said high-permittivity films, and said first counter electrodes, said first insulating film having a permittivity much lower than a permittivity of each of said high-permittivity films; and forming a second counter electrode on upper surfaces of said first insulating film and said plurality of first counter electrodes so as to connect upper surfaces of said first counter electrodes exposed on a surface of said first insulating film.

10. A method of manufacturing a semiconductor device as recited in claim 9, wherein sizes of each of said high-permittivity films and each of said first counter electrodes, which are formed on said storage electrodes, are equal to a size of each of said storage electrodes.

11. A method of manufacturing a semiconductor device as recited in claim 9, wherein said high-permittivity film has a relative permittivity of 200 or more.

12. A method of manufacturing a semiconductor device as recited in claim 11, wherein said storage electrodes includes ruthenium oxide, said high-permittivity films are made of barium strontium titanate, said first counter electrodes are made of titanium nitride, said first insulating film is made of silicon oxide, and said second counter electrode is made of titanium nitride.

13. A method of manufacturing a semiconductor device as recited in claim 12, wherein said barium strontium titanate is formed by RF magnetron sputtering.

14. A method of manufacturing a semiconductor device as recited in claim 12, wherein said storage electrodes further include titanium nitride.

15. A method of manufacturing a semiconductor device as recited in claim 9, wherein said storage electrodes include tantalum and platinum.

16. A method of manufacturing a semiconductor device as recited in claim 9, further including the step of forming a second insulating film between said semiconductor substrate and said storage electrode.

17. A method of manufacturing a semiconductor device, comprising the steps of:

forming a plurality of storage electrodes at respective positions over a major surface of a semiconductor substrate;

sequentially forming a high-permittivity film, a first counter electrode film, and first insulating film, over said plurality of storage electrodes and said semiconductor substrate, so as to contact upper and side surfaces of said storage electrodes;

sequentially etching said first insulating film, said first counter electrode film, and said high-permittivity film to form a plurality of high-permittivity films and a plurality of first counter electrodes on said plurality of storage electrodes;

burying a second insulating film between a plurality of convex multi-layered structures, said plurality of convex multi-layered structures being adjacent each other and consisting of said storage electrodes, said high-permittivity films, and said first counter electrodes, said second insulating film having a permittivity much lower than a permittivity of each of said high-permittivity films; and forming a second counter electrode on upper surfaces of said second insulating film and said plurality of first counter electrodes so as to connect upper surfaces of said first counter electrodes exposed on a surface of said second insulating film.

18. A method of manufacturing a semiconductor device as recited in claim 17, wherein sizes of each of said high-permittivity films and each of said first counter electrodes, which are formed on said storage electrodes, are larger in size than each of said storage electrodes.

19. A method of manufacturing a semiconductor device as recited in claim 17, wherein said high-permittivity film has a relative permittivity of 200 or more.

20. A method of manufacturing a semiconductor device as recited in claim 19, wherein said storage electrodes includes ruthenium oxide, said high-permittivity films are made of barium strontium titanate, said first counter electrodes are made of titanium nitride, said first insulating film is made of silicon oxide, and said second counter electrode is made of titanium nitride.

21. A method of manufacturing a semiconductor device as recited in claim 20, wherein said barium strontium titanate is formed by RF magnetron sputtering.

22. A method of manufacturing a semiconductor device as recited in claim 20, wherein said storage electrodes further include titanium nitride.

23. A method of manufacturing a semiconductor device as recited in claim 17, wherein said storage electrodes include tantalum and platinum.

24. A method of manufacturing a semiconductor device as recited in claim 17, further including the step of forming a third insulating film between said semiconductor substrate and said storage electrode.

* * * * *